(12) United States Patent
Fang et al.

(10) Patent No.: US 7,990,202 B2
(45) Date of Patent: Aug. 2, 2011

(54) SYSTEM AND METHOD FOR DRIVING BIPOLAR TRANSISTORS IN SWITCHING POWER CONVERSION

(75) Inventors: Lieyi Fang, Shanghai (CN); Shifeng Zhao, Shanghai (CN); Zhiliang Chen, Shanghai (CN); Zhenhua Li, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 988 days.

(21) Appl. No.: 11/327,155

(22) Filed: Jan. 5, 2006

(65) Prior Publication Data
US 2007/0139095 A1  Jun. 21, 2007

(30) Foreign Application Priority Data
Dec. 21, 2005  (CN) .......................... 2005 1 0111968

(51) Int. Cl.
*H03K 17/687* (2006.01)
(52) U.S. Cl. ........................................ 327/427; 327/108
(58) Field of Classification Search .................. 327/427, 327/432, 433, 108; 323/282–286, 22, 267, 323/268, 351, 290; 363/21.04, 21.07, 21.12, 21.17, 95, 97, 98, 131
See application file for complete search history.

(56) References Cited

U.S. PATENT DOCUMENTS

| | | | |
|---|---|---|---|
| 6,380,796 B2 * | 4/2002 | Sakai et al. | 327/434 |
| 6,605,963 B2 * | 8/2003 | Kitamoto et al. | 326/81 |
| 2004/0212405 A1 * | 10/2004 | Deas et al. | 327/108 |
| 2005/0225362 A1 * | 10/2005 | Halamik et al. | 327/108 |

* cited by examiner

*Primary Examiner* — Lincoln Donovan
*Assistant Examiner* — Diana J Cheng
(74) *Attorney, Agent, or Firm* — Jones Day

(57) ABSTRACT

A system and method for driving a bipolar junction transistor is provided. The system includes a first transistor including a first gate, a first terminal, and a second terminal. The first gate is configured to receive a first control signal. Additionally, the system includes a second transistor including a second gate, a third terminal, and a fourth terminal. The second gate is configured to receive a second control signal. Moreover, the system includes a first resistor including a fifth terminal and a sixth terminal. The fifth terminal is connected to the first terminal, and the sixth terminal is biased to a first predetermined voltage. The fourth terminal is biased to a second predetermined voltage. The second terminal and the third terminal are connected at a node, and the node is connected to a base for a bipolar junction transistor.

9 Claims, 6 Drawing Sheets

SYSTEM AND METHOD FOR DRIVING BIPOLAR TRANSISTORS IN SWITCHING POWER CONVERSION

CROSS-REFERENCES TO RELATED APPLICATIONS

This application claims priority to Chinese Patent Application No. 200510111968.2, filed Dec. 21, 2005, entitled "System and Method for Driving Bipolar Transistors in Switching Power Conversion," by inventors Lieyi Fang, Shifeng Zhao, Zhiliang Chen, and Zhenhua Li, commonly assigned, incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to integrated circuits. More particularly, the invention provides a system and method for driving bipolar junction transistors. Merely by way of example, the invention has been applied to a power converter. But it would be recognized that the invention has a much broader range of applicability.

Power converters are widely used for consumer electronics such as portable devices. The power converters can convert electric power from one form to another form. As an example, the electric power is transformed from alternate current (AC) to direct current (DC), from DC to AC, from AC to AC, or from DC to DC. Additionally, the power converters can convert the electric power from one voltage level to another voltage level.

The power converters include linear converters and switch-mode converters. The switch-mode converters often have higher efficiency than the linear converters, and usually use power transistors as switches. For example, the power transistors are field effect transistors, bipolar junction transistors, insulated gate bipolar transistors, and/or other types of transistor. The power switches often receive control signals from pulse-width-modulated (PWM) controllers and/or pulse-frequency-modulated (PFM) controllers. The control signals can be adjusted in response to output loads by sensing output voltages or currents.

FIG. 1 is a simplified conventional switch-mode converter with power switch. A switch-mode power converter 100 includes an over-current-protection (OCP) comparator 110, a PWM controller component 120, a gate driver 130, a power switch 140, a primary winding 150, and a secondary winding 160. The power switch 140 is a field effect transistor such as a high-voltage power MOSFET and is used to control power delivered to the secondary side of the switch-mode power converter 100. For example, if the current of the primary winding 160 is greater than a limiting level, the PWM controller component 120 turns off the power switch 140 and shuts down the switch-mode power converter 100.

As a power switch, a high-voltage power MOSFET and a high-voltage power bipolar NPN transistor can achieve similar performance for low power applications. But the high-voltage power MOSFET is often significantly more expensive than the high-voltage power bipolar NPN transistor. Hence it is often desirable to use the bipolar NPN transistor instead of the MOSFET in a switch-mode power converter for low power applications to lower the costs.

But the operation of a MOSFET and the operation of a bipolar junction transistor (BJT) are different. The MOSFET is a voltage controlled device; in contrast the BJT is a current controlled device. As an example, for MOSFET, the drain-to-source current is turned on and off by the gate voltage. As another example, for BJT, the collector current is turned on and off by the base current. Therefore, a system and method for driving a power MOSFET often cannot be used for driving a power BJT.

Hence it is highly desirable to improve techniques for driving bipolar junction transistors.

BRIEF SUMMARY OF THE INVENTION

The present invention is directed to integrated circuits. More particularly, the invention provides a system and method for driving bipolar junction transistors. Merely by way of example, the invention has been applied to a power converter. But it would be recognized that the invention has a much broader range of applicability.

According to one embodiment of the present invention, a system for driving a bipolar junction transistor is provided. The system includes a first transistor including a first gate, a first terminal, and a second terminal. The first gate is configured to receive a first control signal. Additionally, the system includes a second transistor including a second gate, a third terminal, and a fourth terminal. The second gate is configured to receive a second control signal. Moreover, the system includes a first resistor including a fifth terminal and a sixth terminal. The fifth terminal is connected to the first terminal, and the sixth terminal is biased to a first predetermined voltage. The fourth terminal is biased to a second predetermined voltage. The second terminal and the third terminal are connected at a node, and the node is connected to a base for a bipolar junction transistor. The first control signal and the second control signal each are related to a pulse-width-modulated signal for a power converter, and the power converter includes a primary winding associated with a current. The bipolar junction transistor is configured to function as a switch related to the current.

According to another embodiment of the present invention, a system for driving a bipolar junction transistor includes a first transistor including a first gate, a first terminal, and a second terminal. The first gate is configured to receive a first control signal, and the first terminal is biased to a first predetermined voltage. Additionally, the system includes a second transistor including a second gate, a third terminal, and a fourth terminal. The second gate is configured to receive a second control signal, and the fourth terminal is biased to a second predetermined voltage. The second terminal and the third terminal are connected at a first node. Moreover, the system includes a first resistor including a fifth terminal and a sixth terminal. The fifth terminal is connected to the first node, and the sixth terminal is connected to a second node. The second node is connected to a base for a bipolar junction transistor. The first control signal and the second control signal each are related to a pulse-width-modulated signal for a power converter. The power converter includes a primary winding associated with a current, and the bipolar junction transistor is configured to function as a switch related to the current.

According to yet another embodiment of the present invention, a system for driving a bipolar junction transistor includes a first transistor including a first gate, a first terminal, and a second terminal. The first gate is configured to receive a first control signal, and the first terminal is biased to a first predetermined voltage. Additionally, the system includes a second transistor including a second gate, a third terminal, and a fourth terminal. The second gate is configured to receive a second control signal, and the fourth terminal is biased to a second predetermined voltage. Moreover, the system includes a first resistor including a fifth terminal and a sixth terminal. The fifth terminal is connected to the second terminal, and the third terminal and the sixth terminal are connected at a node. The node is connected to a base for a bipolar junction transistor. The first control signal and the second control signal each are related to a pulse-width-modulated signal for a power converter. The power converter includes a primary winding associated with a current, and the bipolar transistor is configured to function as a switch related to the current.

According to yet another embodiment, a system for controlling a power converter includes a first resistor including a first resistor terminal and a second resistor terminal, and a bipolar junction transistor including a base, a collector, and an emitter. Additionally, the system includes an integrated circuit chip. The integrated circuit chip includes a transistor including a gate, a first transistor terminal, and a second transistor terminal. Moreover, the integrated circuit chip includes a first chip terminal coupled between the second resistor terminal and the first transistor terminal, a second chip terminal coupled to the base of the bipolar junction transistor, and a third chip terminal configured to receive a first signal associated with a first current related to a primary winding for a power converter. Also, the integrated circuit chip includes a fourth chip terminal configured to receive a second signal associated with a second current related to a secondary winding for the power converter, a fifth chip terminal configured to provide a first predetermined voltage to the integrated circuit chip, and a sixth terminal configured to provide a second predetermined voltage to the integrated circuit chip. The bipolar junction transistor is configured to function as a switch related to the first current.

Many benefits are achieved by way of the present invention over conventional techniques. For example, some embodiments of the present invention provides a system and method for driving a power bipolar junction transistor in a PWM controlled switch-mode power converter. For example, the switch-mode power converter is an offline fly-back converter or a forward converter. Certain embodiments of the present invention can lower costs for a switch-mode power converter in low power applications.

Depending upon embodiment, one or more of these benefits may be achieved. These benefits and various additional objects, features and advantages of the present invention can be fully appreciated with reference to the detailed description and accompanying drawings that follow.

DETAILED DESCRIPTION OF THE INVENTION

The present invention is directed to integrated circuits. More particularly, the invention provides a system and method for driving bipolar junction transistors. Merely by way of example, the invention has been applied to a power converter. But it would be recognized that the invention has a much broader range of applicability.

Figure 1:
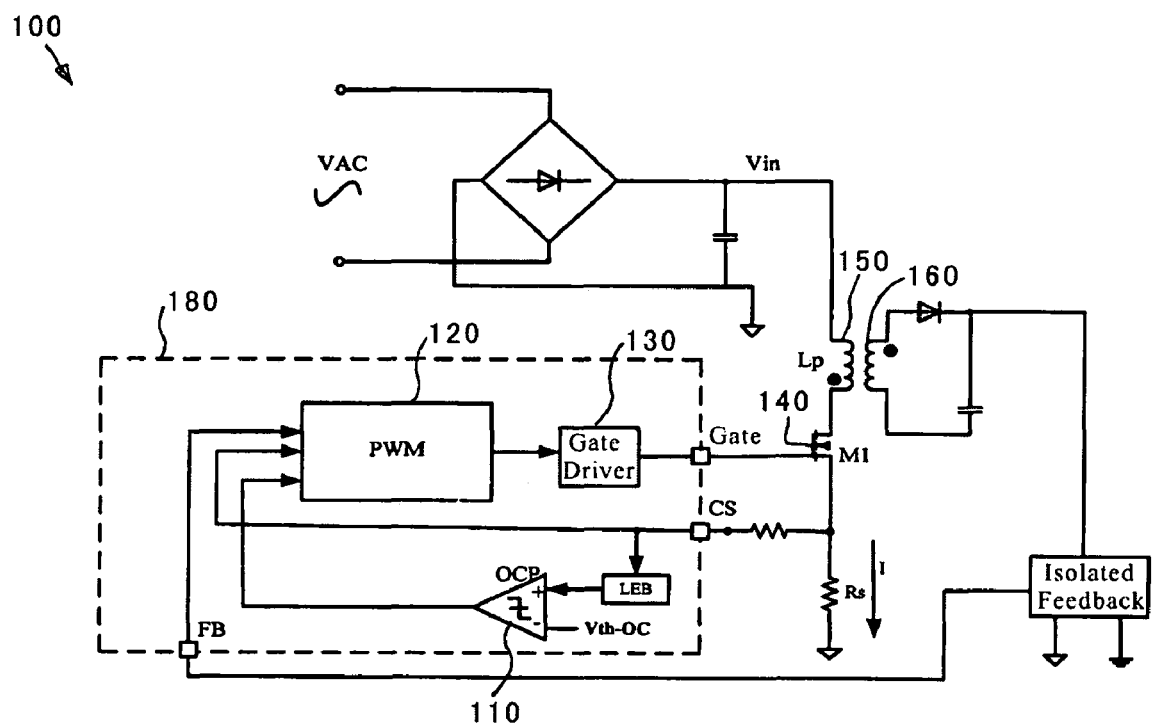
FIG. 1 is a simplified conventional switch-mode converter with power switch.
Figure 2:
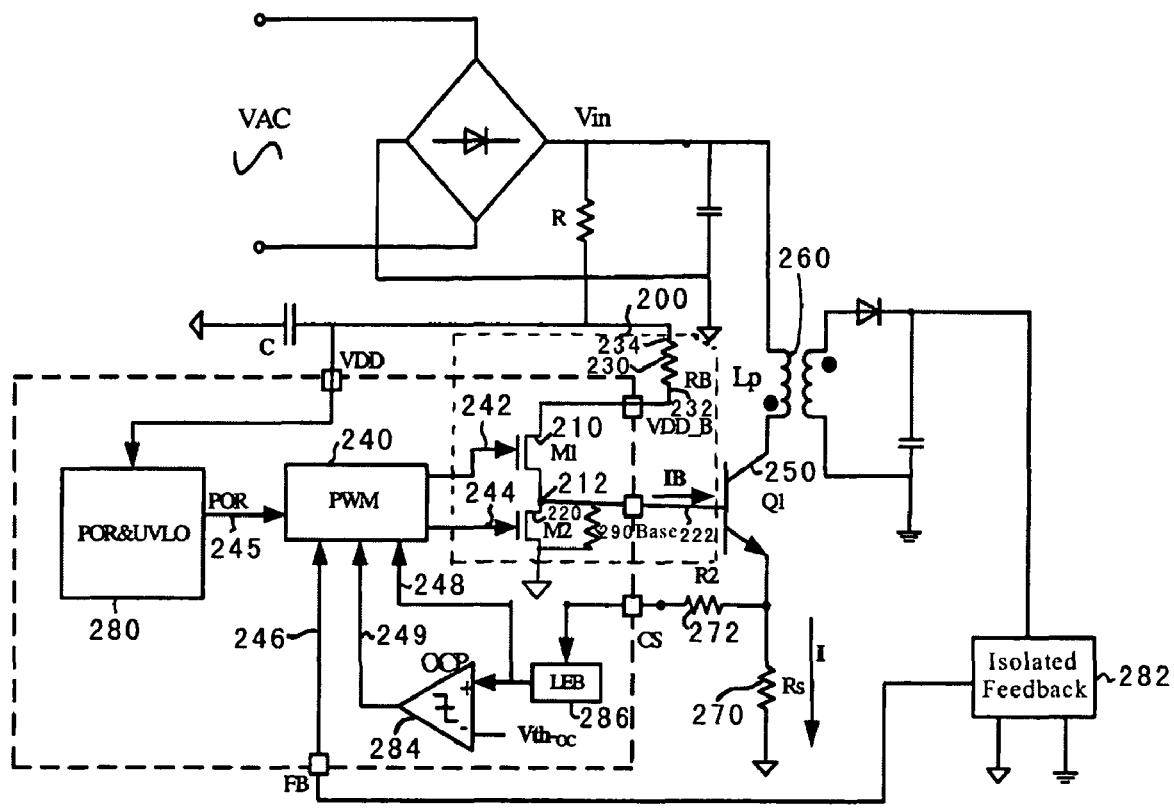
FIG. 2 is a simplified system for driving bipolar junction transistor according to an embodiment of the present invention.

FIG. 2 is a simplified system for driving bipolar junction transistor according to an embodiment of the present invention. This diagram is merely an example, which should not unduly limit the scope of the claims. One of ordinary skill in the art would recognize many variations, alternatives, and modifications. The system 200 includes transistors 210 and 220, and a resistor 230. Although the above has been shown using a selected group of components for the system 200, there can be many alternatives, modifications, and variations. For example, some of the components may be expanded and/or combined. Other components may be inserted to those noted above. For example, the system 200 includes a PWM controller component 240. Depending upon the embodiment, the arrangement of components may be interchanged with others replaced. For example, the system 200 is used to regulate a bipolar junction transistor 250. In another example, the bipolar junction transistor 250 is used as a power switch for a power converter. Further details of these components are found throughout the present specification and more particularly below.

As shown in FIG. 2, the gate of the transistor 210 receives a control signal 242 from the PWM controller component 240, and the gate of the transistor 220 receives a control signal 244 from the PWM controller component 240. For example, the control signals 242 and 244 are related to a PWM signal for a power converter. In another example, the transistors 210 and 220 are NMOS transistors. The source of the transistor 210 and the drain of the transistor 220 are connected at a node 212. The drain of the transistor 210 is connected to a terminal 232 of the resistor 230, and another terminal 234 of the resistor 230 is biased to a first predetermined voltage. For example, the first predetermined voltage is the power supply voltage, $V_{DD}$. Moreover, the substrate of the transistor 210 is biased at the same voltage level as the source of the transistor 210, and the substrate of the transistor 220 is biased at the same voltage level as the source of the transistor 220. Additionally, the source of the transistor 220 is biased to a second predetermined voltage. For example, the second predetermined voltage is the ground voltage. The first predetermined voltage is higher than the second predetermined voltage. As shown in FIG. 2, the system 200 generates an output current 222 at the node 212. For example, the output current 222 is sent to the base of the bipolar junction transistor 250.

In one embodiment, if the signal 242 carries a logic high voltage and the signal 244 carries a logic low voltage, the transistor 210 is turned on and the transistor 220 is turned off. In response, a current would flow from the terminal 234 through the resistor 230 and the resistor 210 to the base of the bipolar junction transistor 250 as the output current 222. For example, the bipolar junction transistor 250 is a bipolar NPN transistor. In another example, the bipolar junction transistor 250 is turned on and works in the saturation region.

For example, the collector of the bipolar junction transistor 250 is connected to a primary winding 260 of a switch-mode power converter. The emitter of the bipolar junction transistor 250 is biased to the second predetermined voltage through a resistor 270. In another example, when the bipolar junction transistor 250 is turned on, the collector current ramps up in response to current build-up by the primary winding 260. Accordingly, the base current is given by:

$$I_B = \frac{V_{DD\_B} - V_{RS} - V_{be}}{R_B + R_{dsM1}} \quad \text{(Equation 1)}$$

where $I_B$ represents the base current. $V_{DD\_B}$ represents the drain voltage for the transistor 210, $V_{RS}$ represents the voltage drop across the resistor 270, and $V_{be}$ represents the base-emitter voltage for the bipolar junction transistor 250. Additionally, $R_B$ is the resistance of the resistor 230, and $R_{dsM1}$ is the on-resistance for the transistor 210. In one embodiment, $V_{DD\_B}$ is much greater than $V_{RS}$ and $V_{be}$, $R_B$ is much larger than $R_{dsM1}$. For example, $V_{RS}$ is less than 1 volt, and $V_{be}$ is equal to about 0.7 volt. Accordingly, Equation 1 becomes:

$$I_B \approx \frac{V_{DD\_B}}{R_B} \quad \text{(Equation 2)}$$

Hence the base current is mainly a function of $V_{DD\_B}$ and $R_B$.

In another embodiment, if the signal 242 carries a logic low voltage and the signal 244 carries a logic high voltage, the transistor 210 is turned off and the transistor 220 is turned on. The base of the bipolar junction transistor 250 is pulled to the second predetermined voltage by the transistor 220. Accordingly, the base current for the bipolar junction transistor 250 becomes zero. The bipolar junction transistor 250 is turned off.

As shown in FIG. 2, the system 200 is used to regulate the bipolar junction transistor 250, which is used as a power switch for a power converter according to an embodiment of the present invention. The bipolar junction transistor 250 is turned on and off by the base current in order to control the power delivered to the output load on the secondary side of the power converter. The base current of the bipolar junction transistor 250 is determined at least in part by the control signals 242 and 244 generated by the PWM controller component 240.

The PWM controller component 240 receives a power-on-reset signal 245, a feedback signal 246, a signal 248, and a protection signal 249. The power-on-reset signal 245 is used to turn on or off the PWM controller component 240, and the protection signal 249 is used to protect the power converter. When the PWM controller component 240 is turned on, the PWM controller component 240 determines the load condition for the power converter based on information associated with the feedback signal 246 and the signal 248. In response to the load condition, the PWM controller can adjust the pulse width related to the control signals 242 and 244. Accordingly, the control signals 242 and 244 determine at least in part the base current of the bipolar junction transistor 250. For example, the base current has a pulse width that is the same as the pulse width for the control signals 242 and 244. The pulsed base current controls the collector current of the bipolar junction transistor 250 and thus also controls the power delivered to the output load on the secondary side of the power converter.

According to one embodiment, the power-on-reset signal 245 is generated by a power-on-reset and under-voltage-lockout system 280. Additionally, the feedback signal 246 is generated by an isolated feedback system 282. Moreover, the signal 248 is generated by a leading edge blanking circuit (LEB) 286, which receives a current sensing signal generated by a resistor 272 and the resistor 270. Also, the protection signal 249 is generated by an OCP comparator 284, which is coupled to the LEB 286.

As discussed above and further emphasized here, FIG. 2 is merely an example, which should not unduly limit the scope of the claims. One of ordinary skill in the art would recognize many variations, alternatives, and modifications. For example, the node 212 is coupled to one terminal of a resistor 290. Another terminal of the resistor 290 is biased to the second predetermined voltage. In one embodiment, the resistor 290 can pull down the voltage level for the base of the bipolar junction transistor 250 to the second predetermined voltage in order to protect the power converter if the integrated circuit is powered off.

Figure 3:
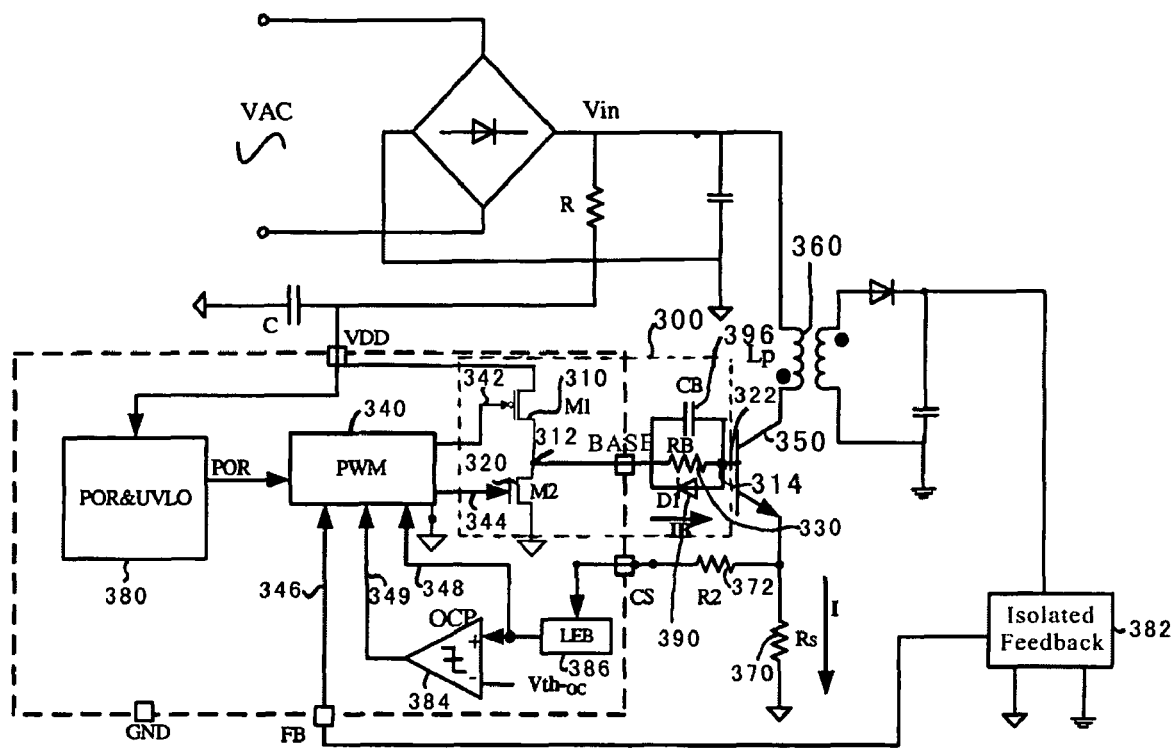
FIG. 3 is a simplified system for driving bipolar junction transistor according to another embodiment of the present invention.

FIG. 3 is a simplified system for driving bipolar junction transistor according to another embodiment of the present invention. This diagram is merely an example, which should not unduly limit the scope of the claims. One of ordinary skill in the art would recognize many variations, alternatives, and modifications. The system 300 includes transistors 310 and 320, a resistor 330, a diode 390, and a capacitor 396. Although the above has been shown using a selected group of components for the system 300, there can be many alternatives, modifications, and variations. For example, some of the components may be expanded and/or combined. Other components may be inserted to those noted above. For example, the system 300 includes a PWM controller component 340. Depending upon the embodiment, the arrangement of components may be interchanged with others replaced. For example, the system 300 is used to regulate a bipolar junction transistor 350. In another example, the bipolar junction transistor 350 is used as a power switch for a power converter. Further details of these components are found throughout the present specification and more particularly below.

As shown in FIG. 3, the gate of the transistor 310 receives a control signal 342 from the PWM controller component 340, and the gate of the transistor 320 receives a control signal 344 from the PWM controller component 340. For example, the control signals 342 and 344 are related to a PWM signal for a power converter. In another example, the transistor 310 is a PMOS transistor, and the transistor 320 is an NMOS transistor. The drain of the transistor 310 and the drain of the transistor 320 are connected at a node 312. The source of the transistor 310 is biased to a first predetermined voltage. For example, the first predetermined voltage is the power supply voltage, $V_{DD}$. Additionally, the source of the transistor 320 is biased to a second predetermined voltage. For example, the second predetermined voltage is the ground voltage. The first predetermined voltage is higher than the second predetermined voltage. Moreover, the substrate of the transistor 310 is biased at the same voltage level as the source of the transistor 310, and the substrate of the transistor 320 is biased at the same voltage level as the source of the transistor 320. As shown in FIG. 3, the resistor 330, the diode 390, and the capacitor 396 are in parallel between the node 312 and a node 314. The system 300 generates an output current 322 at the node 314. For example, the output current 322 is sent to the base of the bipolar junction transistor 350.

In one embodiment, if the signals 342 and 344 each carry a logic low voltage, the transistor 310 is turned on and the transistor 320 is turned off. Accordingly, the base of the bipolar junction transistor is pulled up to the first predetermined voltage. For example, the voltage drop across the capacitor 396 is $V_{DD}$-$V_{be}$-$V_{RS}$. $V_{be}$ represents the base-emitter voltage for the bipolar junction transistor 350, and $V_{RS}$ represents the voltage drop across the resistor 370. In another example, the base current is approximately equal to:

$$I_B \approx \frac{V_{DD}}{R_B} \quad \text{(Equation 3)}$$

where $R_B$ is the resistance of the resistor 330. Hence the base current is mainly a function of $V_{DD}$ and $R_B$. For example, the bipolar junction transistor 350 is a bipolar NPN transistor. In another example, the bipolar junction transistor 350 is turned on and works in the saturation region.

For example, the collector of the bipolar junction transistor 350 is connected to a primary winding 360 of a switch-mode power converter. The emitter of the bipolar junction transistor 350 is biased to the second predetermined voltage through a resistor 370. In another example, when the bipolar junction transistor 350 is turned on, the collector current ramps up in response to current build-up by the primary winding 360.

In another embodiment, if the signals 342 and 344 each carry a logic high voltage, the transistor 310 is turned off and the transistor 320 is turned on. The base of the bipolar junction transistor 350 is pulled to the second predetermined voltage by the transistor 320. Accordingly, the base current for the bipolar junction transistor 350 becomes zero. The bipolar junction transistor 350 is turned off.

As shown in FIG. 3, the diode 390 and the capacitor 396 can facilitate discharging the base region of the bipolar junction transistor 350 according to an embodiment of the present invention. Thus, the bipolar junction transistor 350 is turned off more quickly. In another embodiment, the capacitor 396 can force the base voltage of the bipolar junction transistor 350 to become negative during a transient period when the transistor 320 are being turned on if proper RC time constant for the resistor 330 and the capacitor 396 is selected. For example, it often takes time to discharge the capacitor 396. Hence the voltage drop across the capacitor 396 should remain positive during the transient period. The transient period depends on the RC time constant and, for example, is equal to about tens or hundreds ns. As a result, the base-emitter voltage for the bipolar junction transistor 350 is negative, and the bipolar junction transistor 350 is turned off more quickly. The quick turning off of the bipolar junction transistor 350 can reduce switching loss associated with the bipolar junction transistor 350 and improve efficiency.

According to an embodiment of the present invention, the system 300 is used to regulate the bipolar junction transistor 350, which is used as a power switch for a power converter. The bipolar junction transistor 350 is turned on and off by the base current in order to control the power delivered to the output load on the secondary side of the power converter. The base current of the bipolar junction transistor 350 is determined at least in part by the control signals 342 and 344 generated by the PWM controller component 340.

The PWM controller component 340 receives a power-on-reset signal 345, a feedback signal 346, a signal 348, and a protection signal 349. The power-on-reset signal 345 is used to turn on or off the PWM controller component 340, and the protection signal 349 is used to protect the power converter.

When the PWM controller component 340 is turned on, the PWM controller component 340 determines the load condition for the power converter based on information associated with the feedback signal 346 and the signal 348. In response to the load condition, the PWM controller can adjust the pulse width related to the control signals 342 and 344. Accordingly, the control signals 342 and 344 determine at least in part the base current of the bipolar junction transistor 350. For example, the base current has a pulse width that is the same as the pulse width for the control signals 342 and 344. The pulsed base current controls the collector current of the bipolar junction transistor 350 and thus also controls the power delivered to the output load on the secondary side of the power converter.

According to one embodiment, the power-on-reset signal 345 is generated by a power-on-reset and under-voltage-lock-out system 380. Additionally, the feedback signal 346 is generated by an isolated feedback system 382. Moreover, the signal 348 is generated by a leading edge blanking circuit (LEB) 386, which receives a current sensing signal generated by a resistor 372 and the resistor 370. Also, the protection signal 349 is generated by an OCP comparator 384, which is coupled to the LEB 386.

Figure 4:
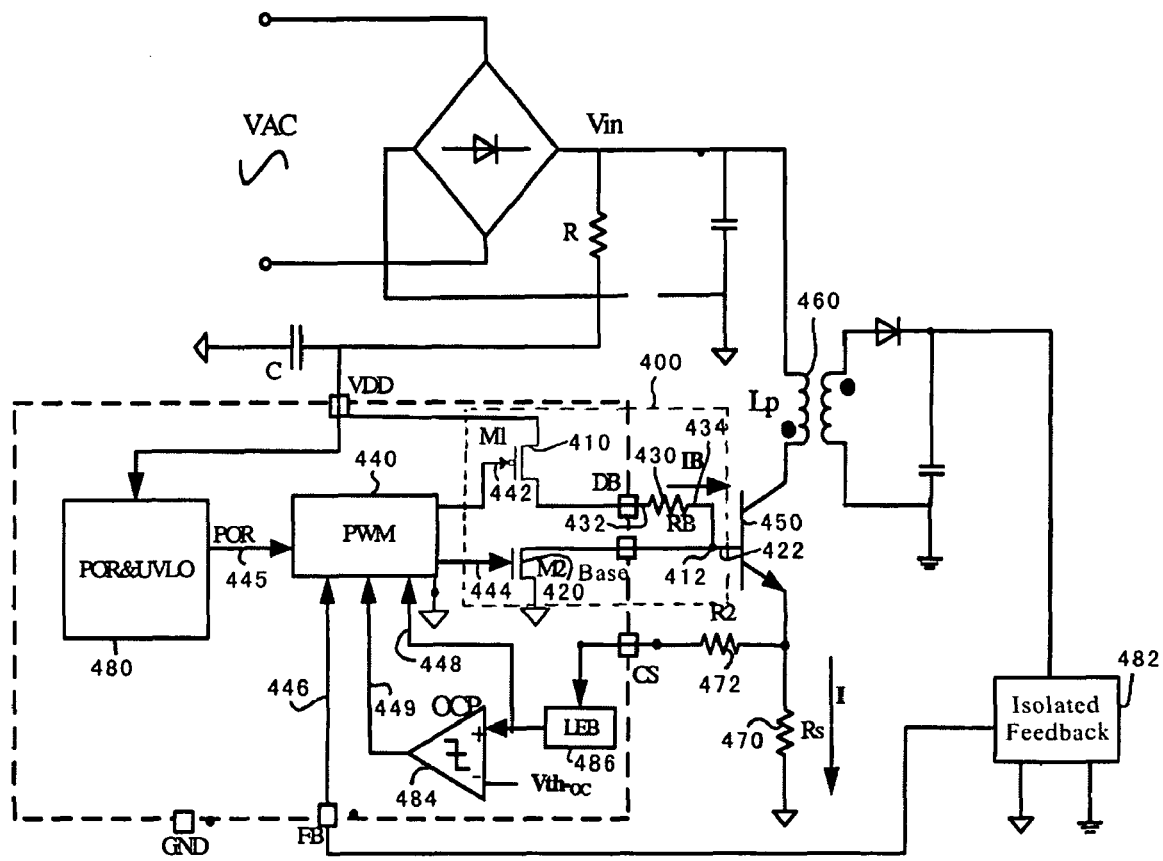
FIG. 4 is a simplified system for driving bipolar junction transistor according to yet another embodiment of the present invention.

FIG. 4 is a simplified system for driving bipolar junction transistor according to yet another embodiment of the present invention. This diagram is merely an example, which should not unduly limit the scope of the claims. One of ordinary skill in the art would recognize many variations, alternatives, and modifications. The system 400 includes transistors 410 and 420, and a resistor 430. Although the above has been shown using a selected group of components for the system 400, there can be many alternatives, modifications, and variations. For example, some of the components may be expanded and/or combined. Other components may be inserted to those noted above. For example, the system 400 includes a PWM controller component 440. Depending upon the embodiment, the arrangement of components may be interchanged with others replaced. For example, the system 400 is used to regulate a bipolar junction transistor 450. In another example, the bipolar junction transistor 450 is used as a power switch for a power converter. Further details of these components are found throughout the present specification and more particularly below.

As shown in FIG. 4, the gate of the transistor 410 receives a control signal 442 from the PWM controller component 440, and the gate of the transistor 420 receives a control signal 444 from the PWM controller component 440. For example, the control signals 442 and 444 are related to a PWM signal for a power converter. In another example, the transistor 410 is a PMOS transistor, and the transistor 420 is an NMOS transistor. The source of the transistor 410 is biased to a first predetermined voltage. For example, the first predetermined voltage is the power supply voltage, $V_{DD}$. Additionally, the source of the transistor 220 is biased to a second predetermined voltage. For example, the second predetermined voltage is the ground voltage. The first predetermined voltage is higher than the second predetermined voltage. The drain of the transistor 410 is connected to a terminal 432 of the resistor 430, and another terminal 434 of the resistor 430 is connected to the drain of the transistor 420 at a node 412. Moreover, the substrate of the transistor 410 is biased at the same voltage level as the source of the transistor 410, and the substrate of the transistor 420 is biased at the same voltage level as the source of the transistor 420. As shown in FIG. 4, the system 400 generates an output current 422 at the node 412. For example, the output current 422 is sent to the base of the bipolar junction transistor 450.

In one embodiment, if the signals 442 and 444 each carry a logic low voltage, the transistor 410 is turned on and the transistor 420 is turned off. Accordingly, the base of the bipolar junction transistor is pulled up to the first predetermined voltage. The base current flows through the resistor 430, and is approximately equal to:

$$I_B \approx \frac{V_{DD}}{R_B} \quad \text{(Equation 4)}$$

where $R_B$ is the resistance of the resistor 430. Hence the base current is mainly a function of $V_{DD}$ and $R_B$. For example, the bipolar junction transistor 450 is a bipolar NPN transistor. In another example, the bipolar junction transistor 450 is turned on and works in the saturation region.

For example, the collector of the bipolar junction transistor 450 is connected to a primary winding 460 of a switch-mode power converter. The emitter of the bipolar junction transistor 450 is biased to the second predetermined voltage through a resistor 470. In another example, when the bipolar junction transistor 450 is turned on, the collector current ramps up in response to current build-up by the primary winding 460.

In another embodiment, if the signals 442 and 444 each carry a logic high voltage, the transistor 410 is turned off and the transistor 420 is turned on. The base of the bipolar junction transistor 450 is pulled to the second predetermined voltage by the transistor 420. Accordingly, the base current for the bipolar junction transistor 450 becomes zero. The bipolar junction transistor 450 is turned off.

According to an embodiment of the present invention, the system 400 is used to regulate the bipolar junction transistor 450, which is used as a power switch for a power converter. The bipolar junction transistor 450 is turned on and off by the base current in order to control the power delivered to the output load on the secondary side of the power converter. The base current of the bipolar junction transistor 450 is determined at least in part by the control signals 442 and 444 generated by the PWM controller component 440.

The PWM controller component 440 receives a power-on-reset signal 445, a feedback signal 446, a signal 448, and a protection signal 449. The power-on-reset signal 445 is used to turn on or off the PWM controller component 440, and the protection signal 449 is used to protect the power converter. When the PWM controller component 440 is turned on, the PWM controller component 440 determines the load condition for the power converter based on information associated with the feedback signal 446 and the signal 448. In response to the load condition, the PWM controller can adjust the pulse width related to the control signals 442 and 444. Accordingly, the control signals 442 and 444 determine at least in part the base current of the bipolar junction transistor 450. For example, the base current has a pulse width that is the same as the pulse width for the control signals 442 and 444. The pulsed base current controls the collector current of the bipolar junction transistor 450 and thus also controls the power delivered to the output load on the secondary side of the power converter.

According to one embodiment, the power-on-reset signal 445 is generated by a power-on-reset and under-voltage-lockout system 480. Additionally, the feedback signal 446 is generated by an isolated feedback system 482. Moreover, the current sensing signal 448 is generated by a leading edge blanking circuit (LEB) 486, which receives a current sensing signal generated by a resistor 472 and the resistor 470. Also, the protection signal 449 is generated by an OCP comparator 484, which is coupled to the LEB 486.

Figure 5:
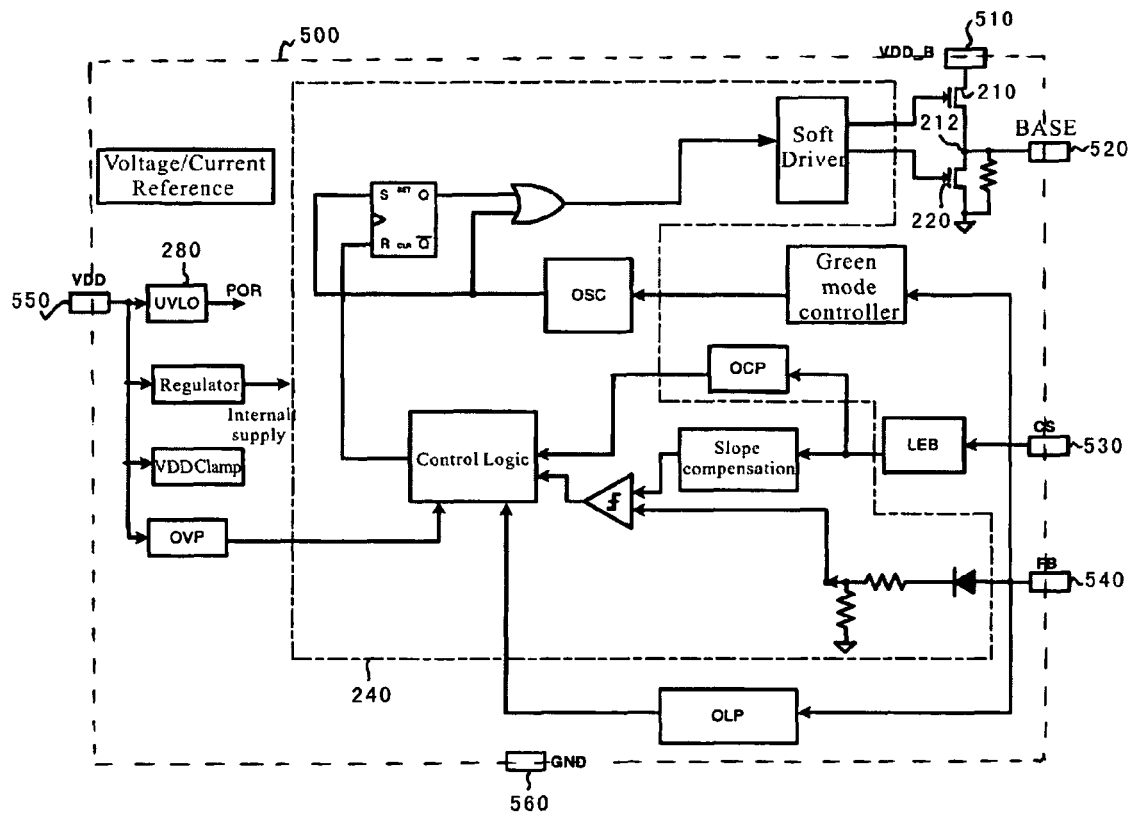
FIG. 5 is a simplified control system for switch-mode power converter according to an embodiment of the present invention.

FIG. 5 is a simplified control system for switch-mode power converter according to an embodiment of the present invention. This diagram is merely an example, which should not unduly limit the scope of the claims. One of ordinary skill in the art would recognize many variations, alternatives, and modifications. The system is an integrated circuit chip 500, which includes terminals 510, 520, 530, 540, 550, and 560. For example, the terminals 510, 520, 530, 540, 550, and 560 each are a pin. Although the above has been shown using a selected group of components for the system, there can be many alternatives, modifications, and variations. For example, some of the components may be expanded and/or combined. Other components may be inserted to those noted above. Depending upon the embodiment, the arrangement of components may be interchanged with others replaced. For example, the system is used for regulating a bipolar junction transistor. In another example, the bipolar junction transistor is used as a power switch for a power converter. Further details of these components are found throughout the present specification and more particularly below.

In one embodiment, the terminal 510 provides a supply voltage to the system 200 for driving the bipolar junction transistor 250. For example, the terminal 510 is directly connected to the drain of the transistor 210 and the terminal 232 of the resistor 230. In another example, the transistor 210 is on the integrated circuit chip 500, and the resistor 230 is external to the integrated circuit chip 500.

In another embodiment, the terminal 520 provides a base current to drive a bipolar junction transistor. For example, the terminal 520 is directly connected to the node 212 and the base of the bipolar junction transistor 250. In another example, the bipolar junction transistor 250 is external to the integrated circuit chip 500.

In yet another embodiment, the terminal 530 provides to the integrated circuit chip 500 a sensing signal associated with a current related to the primary side of the power converter. For example, the primary side of the power converter includes a primary winding. In another example, the terminal 530 is connected to the resistor 272, the PWM controller component 240, and the LEB 286. In yet another example, the PWM controller component 240 and the LEB 286 are on the integrated circuit chip 500, and the resistor 272 is external to the integrated circuit chip 500.

In yet another embodiment, the terminal 540 provides to the integrated circuit chip 500 a feedback signal associated with a current related to the secondary side of the power converter. For example, the secondary side of the power converter includes a secondary winding. In another example, the terminal 540 is connected to the isolated feedback system 282 and the PWM controller component 240. In yet another example, the PWM controller component 240 is on the integrated circuit chip 500, and the isolated feedback system 282 is external to the integrated circuit chip 500.

In yet another embodiment, the terminal 550 provides a first predetermined voltage to the integrated circuit chip 500. For example, the terminal 550 provides a power supply voltage. In another example, the terminal 550 is connected to at least the power-on-reset and under-voltage-lockout system 280, which is on the integrated circuit chip 500. In yet another embodiment, the terminal 560 provides a second predetermined voltage to the integrated circuit chip 500. For example, the terminal 560 provides the ground voltage. In another example, the terminal 560 is connected to the source of the transistor 220, which is on the integrated circuit chip 500.

Figure 6:
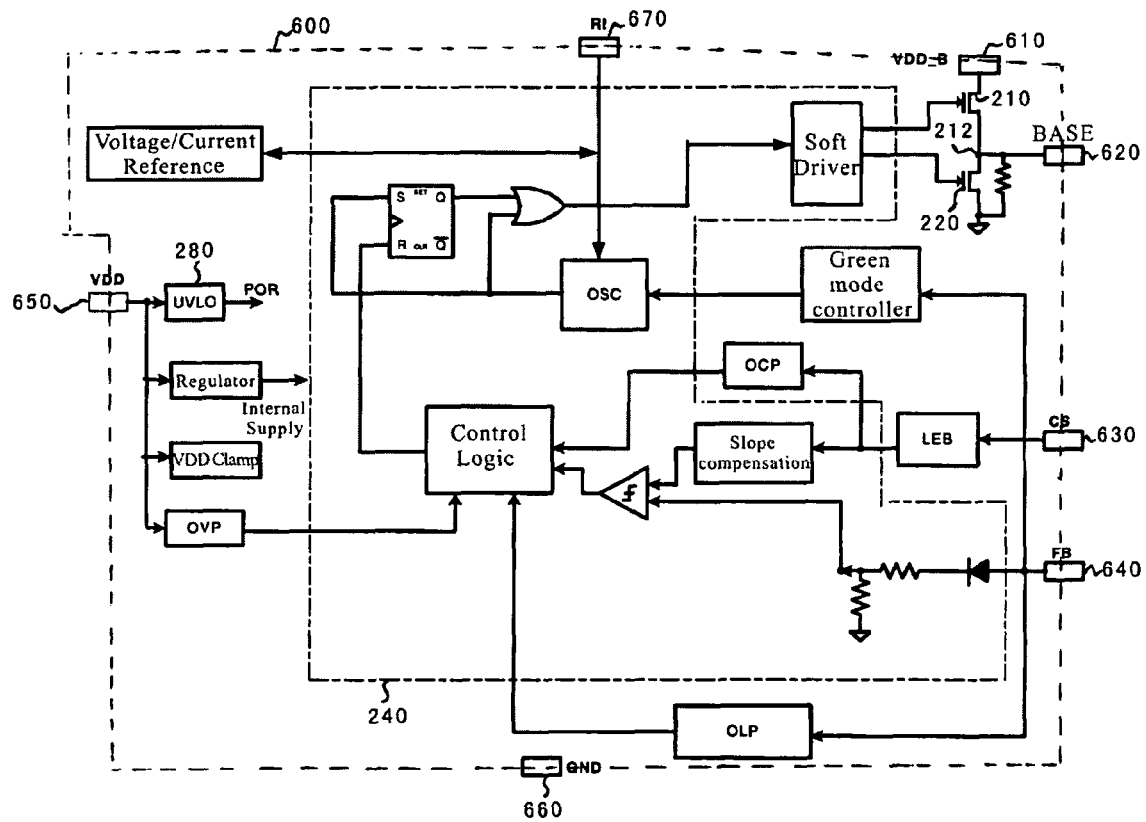
FIG. 6 is a simplified control system for switch-mode power converter according to another embodiment of the present invention.

FIG. 6 is a simplified control system for switch-mode power converter according to another embodiment of the present invention. This diagram is merely an example, which should not unduly limit the scope of the claims. One of ordinary skill in the art would recognize many variations, alternatives, and modifications. The system is an integrated circuit chip 600, which includes terminals 610, 620, 630, 640, 650, 660, and 670. For example, the terminals 610, 620, 630, 640, 650, 660, and 670 each are a pin. Although the above has been shown using a selected group of components for the system, there can be many alternatives, modifications, and variations. For example, some of the components may be expanded and/or combined. Other components may be inserted to those noted above. Depending upon the embodiment, the arrangement of components may be interchanged with others replaced. For example, the system is used for regulating a bipolar junction transistor. In another example, the bipolar junction transistor is used as a power switch for a power converter. Further details of these components are found throughout the present specification and more particularly below.

In one embodiment, the terminal 610 provides a supply voltage to the system 200 for driving the bipolar junction transistor 250. For example, the terminal 610 is directly connected to the drain of the transistor 210 and the terminal 232 of the resistor 230. In another example, the transistor 210 is on the integrated circuit chip 600, and the resistor 230 is external to the integrated circuit chip 600.

In another embodiment, the terminal 620 provides a base current to drive a bipolar junction transistor. For example, the terminal 620 is directly connected to the node 212 and the base of the bipolar junction transistor 250. In another example, the bipolar junction transistor 250 is external to the integrated circuit chip 600.

In yet another embodiment, the terminal 630 provides to the integrated circuit chip 600 a sensing signal associated with a current related to the primary side of the power converter. For example, the primary side of the power converter includes a primary winding. In another example, the terminal 630 is connected to the resistor 272, the PWM controller component 240, and the LEB 286. In yet another example, the PWM controller component 240 and the LEB 286 are on the integrated circuit chip 600, and the resistor 272 is external to the integrated circuit chip 600.

In yet another embodiment, the terminal 640 provides to the integrated circuit chip 600 a feedback signal associated with a current related to the secondary side of the power converter. For example, the secondary side of the power converter includes a secondary winding. In another example, the terminal 640 is connected to the isolated feedback system 282 and the PWM controller component 240. In yet another example, the PWM controller component 240 is on the integrated circuit chip 600, and the isolated feedback system 282 is external to the integrated circuit chip 600.

In yet another embodiment, the terminal 650 provides a first predetermined voltage to the integrated circuit chip 600. For example, the terminal 650 provides a power supply voltage. In another example, the terminal 650 is connected to at least the power-on-reset and under-voltage-lockout system 280, which is on the integrated circuit chip 600. In yet another embodiment, the terminal 660 provides a second predetermined voltage to the integrated circuit chip 600. For example, the terminal 660 provides the ground voltage. In another example, the terminal 660 is connected to the source of the transistor 220, which is on the integrated circuit chip 600. In yet another embodiment, the terminal 670 is the input/output terminal for determine the switching frequency for the PWM controller component 240.

According to another embodiment of the present invention, a system for driving a bipolar junction transistor is provided. The system includes a first transistor including a first gate, a first terminal, and a second terminal. The first gate is configured to receive a first control signal. Additionally, the system includes a second transistor including a second gate, a third terminal, and a fourth terminal. The second gate is configured to receive a second control signal. Moreover, the system includes a first resistor including a fifth terminal and a sixth terminal. The fifth terminal is connected to the first terminal, and the sixth terminal is biased to a first predetermined voltage. The fourth terminal is biased to a second predetermined voltage. The second terminal and the third terminal are connected at a node, and the node is connected to a base for a bipolar junction transistor. The first control signal and the second control signal each are related to a pulse-width-modulated signal for a power converter, and the power converter includes a primary winding associated with a current. The bipolar junction transistor is configured to function as a switch related to the current. For example, the system is implemented according to the system 200.

According to yet another embodiment of the present invention, a system for driving a bipolar junction transistor includes a first transistor including a first gate, a first terminal, and a second terminal. The first gate is configured to receive a first control signal, and the first terminal is biased to a first predetermined voltage. Additionally, the system includes a second transistor including a second gate, a third terminal, and a fourth terminal. The second gate is configured to receive a second control signal, and the fourth terminal is biased to a second predetermined voltage. The second terminal and the third terminal are connected at a first node. Moreover, the system includes a first resistor including a fifth terminal and a sixth terminal. The fifth terminal is connected to the first node, and the sixth terminal is connected to a second node. The second node is connected to a base for a bipolar junction transistor. The first control signal and the second control signal each are related to a pulse-width-modulated signal for a power converter. The power converter includes a primary winding associated with a current, and the bipolar junction transistor is configured to function as a switch related to the current. For example, the system is implemented according to the system 300.

According to yet another embodiment of the present invention, a system for driving a bipolar junction transistor includes a first transistor including a first gate, a first terminal, and a second terminal. The first gate is configured to receive a first control signal, and the first terminal is biased to a first predetermined voltage. Additionally, the system includes a second transistor including a second gate, a third terminal, and a fourth terminal. The second gate is configured to receive a second control signal, and the fourth terminal is biased to a second predetermined voltage. Moreover, the system includes a first resistor including a fifth terminal and a sixth terminal. The fifth terminal is connected to the second terminal, and the third terminal and the sixth terminal are connected at a node. The node is connected to a base for a bipolar junction transistor. The first control signal and the second control signal each are related to a pulse-width-modulated signal for a power converter. The power converter includes a primary winding associated with a current, and the bipolar junction transistor is configured to function as a switch related to the current. For example, the system is implemented according to the system 400.

According to yet another embodiment, a system for controlling a power converter includes a first resistor including a first resistor terminal and a second resistor terminal, and a bipolar junction transistor including a base, a collector, and an emitter. Additionally, the system includes an integrated circuit chip. The integrated circuit chip includes a transistor including a gate, a first transistor terminal, and a second transistor terminal. Moreover, the integrated circuit chip includes a first chip terminal coupled between the second resistor terminal and the first transistor terminal, a second chip terminal coupled to the base of the bipolar junction transistor, and a third chip terminal configured to receive a first signal associated with a first current related to a primary winding for a power converter. Also, the integrated circuit chip includes a fourth chip terminal configured to receive a second signal associated with a second current related to a secondary winding for the power converter, a fifth chip terminal configured to provide a first predetermined voltage to the integrated circuit chip, and a sixth terminal configured to provide a second predetermined voltage to the integrated circuit chip. The bipolar junction transistor is configured to function as a switch related to the first current. For example, the system is implemented according to FIG. 5. In another example, the gate is configured to receive a control signal related to a pulse-width-modulated signal for the power converter, and the integrated circuit chip further includes a seventh chip terminal for determining a switching frequency related to the pulse-width-modulated signal. In yet another example, the system is implemented according to FIG. 6.

The present invention has various advantages. Some embodiments of the present invention provides a system and method for driving a power bipolar junction transistor in a PWM controlled switch-mode power converter. For example, the switch-mode power converter is an offline fly-back converter or a forward converter. Certain embodiments of the present invention can lower costs for a switch-mode power converter in low power applications.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for driving a bipolar junction transistor, the system comprising:
a first transistor including a first gate, a first terminal, and a second terminal, the first gate being configured to receive a first control signal;
a second transistor including a second gate, a third terminal, and a fourth terminal, the second gate being configured to receive a second control signal, the second control signal being separate from the first control signal;
a first resistor including a fifth terminal and a sixth terminal, the fifth terminal being connected to the first terminal, the sixth terminal being biased to a first predetermined voltage; and
a second resistor including two terminals, the second resistor not being a part of any transistor;
wherein:
the fourth terminal is biased to a second predetermined voltage;
the second terminal and the third terminal are connected at a node;
one of the two terminals is coupled to the node;
the other one of the two terminals is biased to the second predetermined voltage;
the node is connected to a base for a bipolar junction transistor;
the first control signal and the second control signal each are related to a pulse-width-modulated signal for a power converter;
the power converter includes a primary winding associated with a current; and
the bipolar junction transistor is configured to function as a switch related to the current.

2. The system of claim 1 wherein the first control signal and the second control signal are generated by a pulse-width-modulated controller component.

3. The system of claim 1 wherein the first transistor and the second transistor each are an NMOS transistor.

4. The system of claim 3 wherein:
the first terminal is a first drain for the first transistor;
the second terminal is a first source for the first transistor;
the third terminal is a second drain for the second transistor; and
the fourth terminal is a second source for the second transistor.

5. The system of claim 4 wherein the first predetermined voltage is higher than the second predetermined voltage.

6. The system of claim 5 wherein:
the first predetermined voltage is associated with a supply voltage; and
the second predetermined voltage is associated with a ground voltage.

7. The system of claim 3 wherein if the first control signal is at a logic high voltage level, the second control signal is at a logic low voltage level.

8. The system of claim 7 wherein if the first control signal is at the logic low voltage level, the second control signal is at the logic high voltage level.

9. The system of claim 1 wherein the bipolar junction transistor is a bipolar NPN transistor.

* * * * *